United States Patent
Sun et al.

(10) Patent No.: US 8,229,135 B2
(45) Date of Patent: Jul. 24, 2012

(54) AUDIO ENHANCEMENT METHOD AND SYSTEM

(75) Inventors: Xiaobing Sun, Singapore (SG); Kanzo Okada, Singapore (SG); Peng Gao, Singapore (SG); Ching Biing Yeo, Singapore (SG)

(73) Assignee: Sony Corporation, Tokyo (JP)

( * ) Notice: Subject to any disclaimer, the term of this patent is extended or adjusted under 35 U.S.C. 154(b) by 1188 days.

(21) Appl. No.: 12/001,380

(22) Filed: Dec. 11, 2007

(65) Prior Publication Data

US 2008/0170721 A1    Jul. 17, 2008

(30) Foreign Application Priority Data

Jan. 12, 2007 (SG) ................. 200700142-3

(51) Int. Cl.
*H03G 5/00* (2006.01)

(52) U.S. Cl. .............. 381/98; 381/103; 381/61

(58) Field of Classification Search .......... 381/98, 381/103, 61
See application file for complete search history.

(56) References Cited

U.S. PATENT DOCUMENTS

| | | | | |
|---|---|---|---|---|
| 5,930,373 | A * | 7/1999 | Shashoua et al. | 381/98 |
| 7,295,809 | B2 * | 11/2007 | Moore | 455/41.2 |
| 7,729,497 | B2 * | 6/2010 | Van Reck | 381/61 |
| 8,005,233 | B2 * | 8/2011 | Smith | 381/61 |
| 2003/0055627 | A1 * | 3/2003 | Balan et al. | 704/200.1 |
| 2004/0162720 | A1 * | 8/2004 | Jang et al. | 704/200.1 |
| 2005/0245221 | A1 * | 11/2005 | Beyer | 455/222 |
| 2006/0159283 | A1 * | 7/2006 | Mathew et al. | 381/98 |
| 2008/0152175 | A1 * | 6/2008 | Kim et al. | 381/300 |
| 2008/0170721 | A1 * | 7/2008 | Sun et al. | 381/98 |
| 2009/0147963 | A1 * | 6/2009 | Smith | 381/62 |
| 2010/0063802 | A1 * | 3/2010 | Gao | 704/201 |
| 2010/0158272 | A1 * | 6/2010 | Vickers | 381/98 |
| 2010/0232624 | A1 * | 9/2010 | Zhang | 381/103 |
| 2011/0200195 | A1 * | 8/2011 | Lau et al. | 381/17 |

FOREIGN PATENT DOCUMENTS

| | | |
|---|---|---|
| EP | 1681901 A1 * | 7/2006 |
| JP | 2001-343998 | 12/2001 |
| JP | 2004-328361 | 11/2004 |
| JP | 2006-222867 | 8/2006 |
| RU | 2239278 C1 | 10/2004 |
| SG | 115665 | 10/2005 |
| WO | WO 2008094920 A1 * | 8/2008 |

OTHER PUBLICATIONS

Rosca et al., "Multi-Channel Psychoaccoustically Motivated Speech Enhancement", IEEE International Acoustics, Speech and Signal Processing; vol. 1, Apr. 6-10, 2003, pp. III-217-III-220.

Gustafsson et al., "A Psychoaccoustic Approach to Combined Accoustic Echo Cancellation and Noise Reduction", IEEE Transactions on Speech and Audio Processing, vol. 10, Issue 5, Jul. 2002, pp. 245-256.

* cited by examiner

*Primary Examiner* — Laura Menz

(74) *Attorney, Agent, or Firm* — Robert J. Depke; Rockey, Depke & Lyons, LLC

(57) ABSTRACT

A method for transforming an audio signal and a system employing that method is disclosed. The method proceeds by extracting from the signal components that fall within a stop band, for example, using one or more low-pass filters. Then, a set of one or more harmonics of the extracted components is generated by down-sampling to create an intermediate signal, which is then repeated. Each harmonic is then weighted by controlling its gain by application to it of a respective weighting factor, the factors being determined by the psychoacoustic properties of a system that will reproduce the signal. Then, the weighted harmonics are added to the audio signal (which may have been subject to a delay to ensure synchronization) to create an output signal.

16 Claims, 3 Drawing Sheets

AUDIO ENHANCEMENT METHOD AND SYSTEM

The present application claims priority to Singapore Patent Application No. SG 2007-142-3, filed in the Singapore Patent Office on Jan. 12, 2007, the entire contents of which are incorporated herein by reference.

BACKGROUND TO THE INVENTION

Field of the Invention

This invention relates to a method and a system for enhancement of the output of an audio device. Specifically, it relates to a system and method for psychoacoustic bass enhancement.

Due to limitations imposed by size, power and cost, the speakers used in personal computers, notebooks, portable devices etc., have poor response at the lower part of their frequency range that will result that their reproduction of bass sounds is poor. For an audio beam system such as that disclosed in SG115665, where the audible sound is generated by nonlinear demodulation of a modulated ultrasonic signal, the perceived audio output produced by such devices is inherently poor in low frequency response. A conventional way to enhance the bass quality is to use a frequency equalizer that will boost the amplitude of low-frequency part of the signal. This is not always an effective solution since it increases power consumption and may even damage the speaker. Therefore, other ways for improving the sound quality have also been considered.

One of these alternatives is to enhance the bass by making use of psychoacoustic properties of human hearing system. An example of this is disclosed in U.S. Pat. No. 5,930,373. The apparatus disclosed in that patent includes a harmonics generator coupled to a frequency generator and being capable of generating, for each fundamental frequency within a low frequency range of interest, a residue harmonic signal having a sequence of harmonics. The sequence of harmonics, generated with respect to each fundamental frequency contains a first group of harmonics that includes at least three consecutive harmonics from among a primary set of harmonics of the fundamental frequency. However, although the harmonics can be generated by these techniques, their amplitudes are quite dependent on the applicant of the original fundamental frequency signal.

SUMMARY OF THE INVENTION

The invention operates by processing an audio signal to remove low-frequency components, which would not be reproduced effectively by small transducers, and replacing them with higher-frequency components. The higher-frequency components are selected to have frequencies and amplitudes such the transformation has a minimal perceptual effect upon the signal.

From a first aspect, this invention provides a method for enhancing an audio signal comprising: a. extracting from the signal components that fall within a stop band; b. generating a set of one or more harmonics of the extracted components using a method of down-sampling and repeating; c. weighting each harmonic by controlling its gain by application to it of a respective weighting factor; and d. adding the weighted harmonics to the audio signal to create an output signal.

In such a method, each high-order harmonic can be generated independently and therefore its amplitude is individually adjustable without affect other harmonics. This allows an optimal bass enhancement effect to be produced by combination of the harmonics with appropriate amplitudes.

Typically, the weighting of each harmonic is determined by psychoacoustic analysis of an audio reproduction system by which the transformed signal will be reproduced. The psychoacoustic analysis typically includes analysis of the signal frequency, loudness and duration; that is, it analyses the basic features of the sound.

Most advantageously, each harmonic is generated by creating a down-sampled intermediate signal the audio signal and repeating the intermediate signal such that the harmonic is of duration equal to the audio signal. This allows each harmonic to be generated independently from each other and therefore the amplitude of each harmonic is individually adjustable without affecting the other harmonics. To generate the $n^{th}$ harmonic in such embodiments, the intermediate signal may comprise every $n^{th}$ sample of the audio signal, and the harmonic comprises n repetitions of the intermediate signal. The audio signal is typically segmented prior to step a. The segments may be of equal time duration. This is straightforward to implement and makes optimal use of memory. However, it could introduce discontinuities into the harmonic. Therefore, at least one of the start and the end values of the intermediate signal is preferably adjusted such that the start and the end values are of equal value.

Alternatively, each segment may be bounded by a zero-crossing point of the audio signal. This ensures that no discontinuities are introduced into the harmonic. A segment may preferably be terminated at the first zero crossing of the signal that occurs after a predetermined minimum time has passed following the start of the segment. This ensures that multiple segments of very short duration are not produced when the signal includes frequent zero crossings.

The components are typically extracted in step a. by passing the audio signal through a low-pass filter.

In step a., a plurality of sets of components within a stop band may be extracted, and a set of weighted components are generated, in step b., for each of these sets of weighted components. This allows different harmonics and/or weightings to be applied to different parts of the audio spectrum. That is, the number of harmonics and/or their weightings for the sets of components may be unequal.

It is typically necessary for the audio signal is subject to a delay prior to step d. This ensures that the harmonics and the audio signal are synchronised prior to their being combined.

The method finds particular application where the audio signal is a digital signal (for instance, a digitised analogue signal) and the method is performed in the digital domain. From a second aspect, the invention provides an audio processing device in which an audio signal is enhanced by a method embodying the first aspect of the invention.

In this context of this application, an "audio signal" is a signal that contains an encoded representation of sound. The signal may be constituted by a time-varying electrical voltage, but this is not a limitation to the invention. The signal may have alternative physical manifestations, a time-varying optical signal being one example. It may also have no direct physical manifestation, for example, being represented numerically as computer data.

From a third aspect, this invention provides an audio reproduction system for reproducing an audio signal, in which an audio signal to be reproduced is applied to an audio processing device embodying the second aspect of the invention, an amplifier and a speaker system, in which the weighting of each harmonic is determined by psychoacoustic analysis of the amplifier and a speaker system.

In step b., two, three, four or five consecutive harmonics are typically generated.

The advantages of psychoacoustic bass enhancement using embodiments of the invention include the potential for increasing perceived low-frequency response more than 1.5 octaves, decreasing power consumption by up to 75%, and decreasing speaker enclosure volume by up to 75%.

DETAILED DESCRIPTION OF A PREFERRED EMBODIMENT

Figure 1:
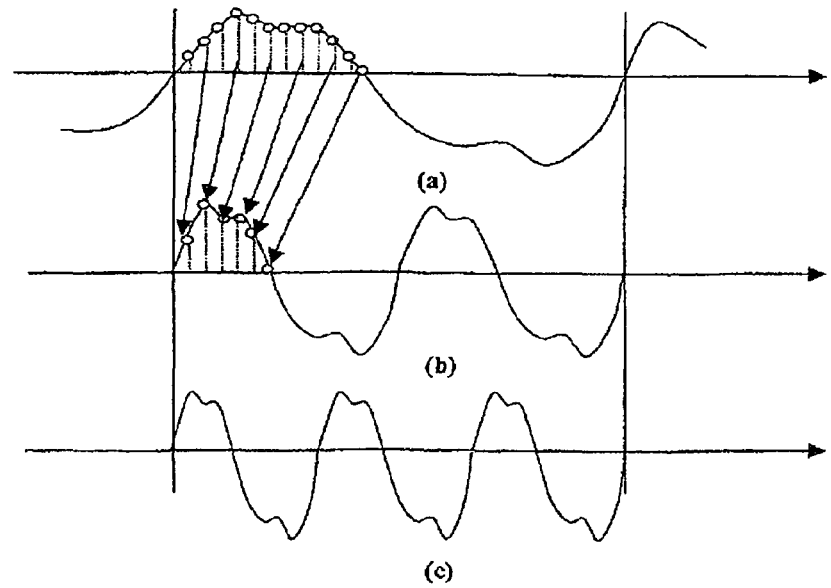
FIG. 1 illustrates generation of harmonics of a waveform, in which trace (a) is segment of the original waveform in memory; trace (b) is the read-out waveform produced by reading one of every two samples and repeating twice to generate the second harmonic; and trace (c) is the read-out waveform produced by reading one of every three samples and repeating three time to generate the third harmonic.

An embodiment of the invention will now be described in detail, by way of example, and with reference to the accompanying drawings.

Introduction to the Theoretical Working of the Embodiment

Sounds are most frequently characterized in terms of four basic quantities: pitch, loudness, duration and timbre. Of these, the most characteristic property of a sound is its pitch. Pitch may be defined as "that attribute of auditory sensation in terms of which sounds may be ordered on a musical scale", a definition accepted by the American Standards Association. In other words, variations in pitch give rise to a sense of melody. Pitch is related to the repetition rate of the waveform of a sound; for a pure tone this corresponds to the frequency, and for a periodic complex tone to the fundamental frequency. Since pitch is a subjective attribute, it cannot be measured directly.

Although the theory of pitch perception in the human hearing system has not been fully established, there is one phenomenon, known as the "phenomenon of the missing fundamental" that is well-recognized.

Consider, as an example, a sound consisting of short impulses (clicks) occurring 200 times per second. This sound has a low pitch, which is very close to the pitch of a 200 Hz pure tone, and a sharp timbre. It contains harmonics with frequencies 200 Hz, 400 Hz, 600 Hz, 800 Hz, etc. According to the phenomenon of the missing fundamental, if the sound is filtered so as to remove the 200 Hz component, the perceived pitch does not alter. The only result is a slight change in the timbre of the note.

The low pitch associated with a group of high harmonics (200 Hz, in the above example) is called the "residue pitch". Experiments show that the residue pitch can be heard even in the presence of low-frequency noise which would mask the component at the fundamental frequency. Thus, the residue pitch may be perceived via neural channels that normally respond to the high-frequency or middle-frequency components of a signal. Even when the fundamental component of a complex tone is present, the pitch of the tone is usually determined by the harmonics rather than the fundamental. Thus, the perception of a residue pitch should not be regarded as unusual. Rather, a residue pitch is what a person normally hears when listening to a complex tone.

Since the a particular pitch can be perceived without the presence of its fundamental frequency component, it should be possible to replace the low-fundamental frequency by its harmonics. This technique can be applied usefully in situations where the low-frequency sounds cannot readily be generated. For example, it is inherently difficult for a small speaker to generate the low-frequency bass because its size is much smaller than the wavelength of the sound.

The Application to this Embodiment

This embodiment operates by transforming a digital representation of an audio signal. In this embodiment, the digital representation has a fixed sampling rate, e.g. 48 kHz. Transformation of the signal takes place in the digital domain.

In the digital domain, a sound waveform is sampled and digitized to be represented as a series of bits. The digital waveform can be stored, down-sampled and repeated. Assume that one segment of the sound waveform is first stored in memory at a fixed sampling rate. Then, the waveform is read out from the memory at several different interleaves. For example, to generate the second harmonic, one of every two samples is read out at the same rate as the sampling rate, i.e. 48 kHz. In order that the second harmonic occupies the same time duration as the original waveform, this process of reading the data from memory is repeated twice. This will produce the second harmonic of the digitised signal. Similarly, the third and higher-order harmonics can be generated. FIG. 1 illustrates the relationship between the digitised waveform and the harmonic. The original waveform at (a) is transformed to its second harmonic represented at (b). One feature of this method for generating harmonics is that since different harmonics are read out by different circuits, the harmonics are naturally separated. It is therefore straightforward to weight each harmonic with different gains after they have been generated. Another feature is that no matter what frequency components are in the fundamental signal, all of its corresponding harmonics are generated; that is, the generation of harmonics is independent of frequency. Moreover, no matter what is the amplitude of the original signal, all of the harmonics are generated in the proportion. That is, the generation of harmonics is independent of amplitude. By simply repeating the process, any order of the harmonics can be generated.

For a practical bass enhancement system, only the harmonics of the low-frequency band, which a speaker cannot effectively generate, need be generated. Therefore, a corresponding low-pass filter must be applied to the signal before it is processed by a harmonic generating circuit.

Figure 2:
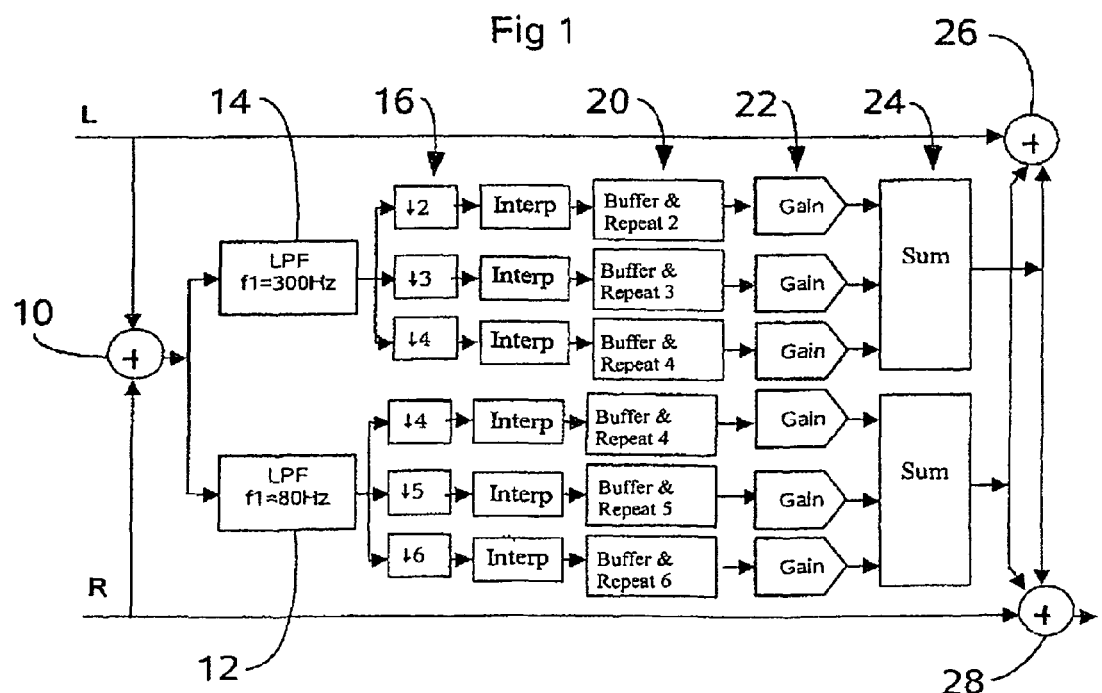
FIG. 2 illustrates a first algorithm that implements an embodiment of the invention.

FIG. 2 illustrates an algorithm that implements a bass enhancement system using the principles of the present invention.

With reference to FIG. 2, in the algorithm, the left (L) and right (R) channel audio inputs are in digital format with a fixed sampling rate of 48 kHz. The L and R channel are added together at 10, followed by two low-pass filters 12, 14 with different cut-off frequencies, in this embodiment, of 80 Hz and 300 Hz respectively. (In an alternative implementation, the 300 Hz low pass filter can be replaced by a band-pass filter with passing band 80 Hz to 300 Hz.) The two low-pass filters 12, 14 are needed to cover the poor low-frequency response band of an audio speaker, such as an audio beam speaker. For example, if an audio beam speaker system cannot efficiently generate frequency components for f<300 Hz; that is, the speaker system will be said to have a stop band extending up to 300 Hz, and a pass band of 300 Hz or higher. The above two low-pass filters 12, 14 are necessary for good bass enhancement in such a system. For example, in the case of a fundamental frequency of 150 Hz, its second, third and fourth harmonics are 300 Hz, 450 Hz and 600 Hz respectively; these harmonics all fall in the pass band of the speaker, and therefore can be generated effectively. While for a fundamental frequency of 80 Hz, the second and third harmonics are 160 Hz and 240 Hz respectively. These are still in the stop band of the speaker system so cannot be effectively generated. However, if the fourth, fifth and sixth harmonics are used, they are 320 Hz, 400 Hz and 480 Hz respectively, which are all within the pass band of the speaker system. Therefore, it is desirable that for different bass frequency bands, different groups of harmonics that include different orders be used.

Alternatively, if the bandwidth of the stop band of a speaker system is not wide, a single low-pass filter with a cut-off frequency that corresponds to the upper bound of the stop band of the speaker may be sufficient.

Figure 3:
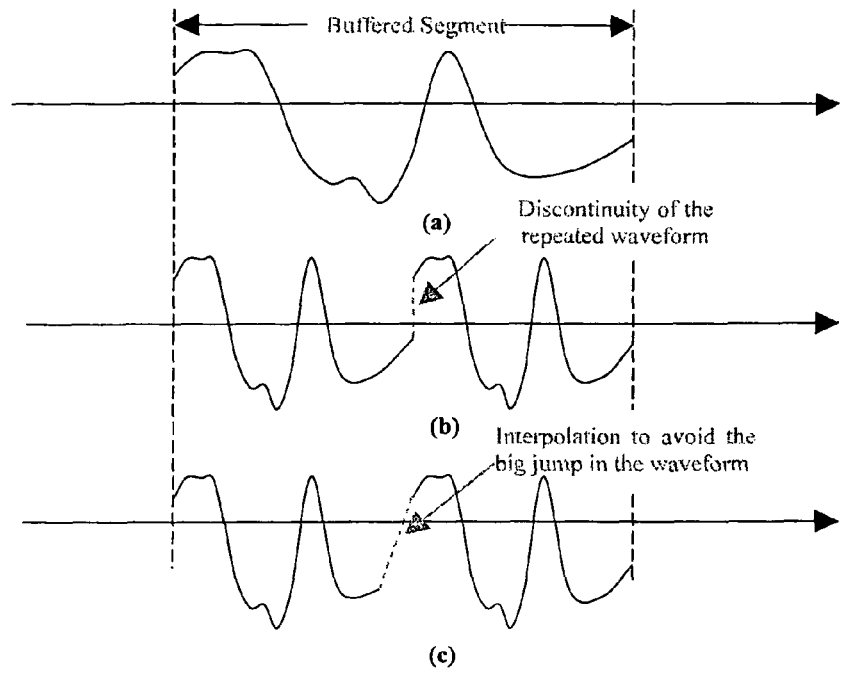
FIG. 3 shows (a) The segmented waveform using fixed buffer size; (b) 2nd harmonic of the waveform by simply repeating the waveform; (c) Interpolated waveform at the end of the repeating waveform to avoid the discontinuity

The segmented waveform that is output from each of the low-pass filters 12, 14 is simultaneously down-sampled by a factor of 2, 3 and 4 at 16, and the down-sampled signals are repeated, respectively, two, three and four times (at 20) to restore their lengths to that of the original signal, and are then stored. During the storage process, the sampling values at the end of the segment will be changed by interpolation as shown in FIG. 3(c) to reduce discontinuity between one segment and the next. Then, the stored samples are read-out at the same sampling rate of the input data (48 kHz in this embodiment). That will produce the second, third, and fourth harmonics respectively. Since these harmonics are generated separately, they can be weighted by different gains (at 22) to produce the best psychoacoustic effect. Finally, at 24, the generated harmonic groups are summed together and the two groups are then added back to the original L and R channels 26, 28.

Figure 4:
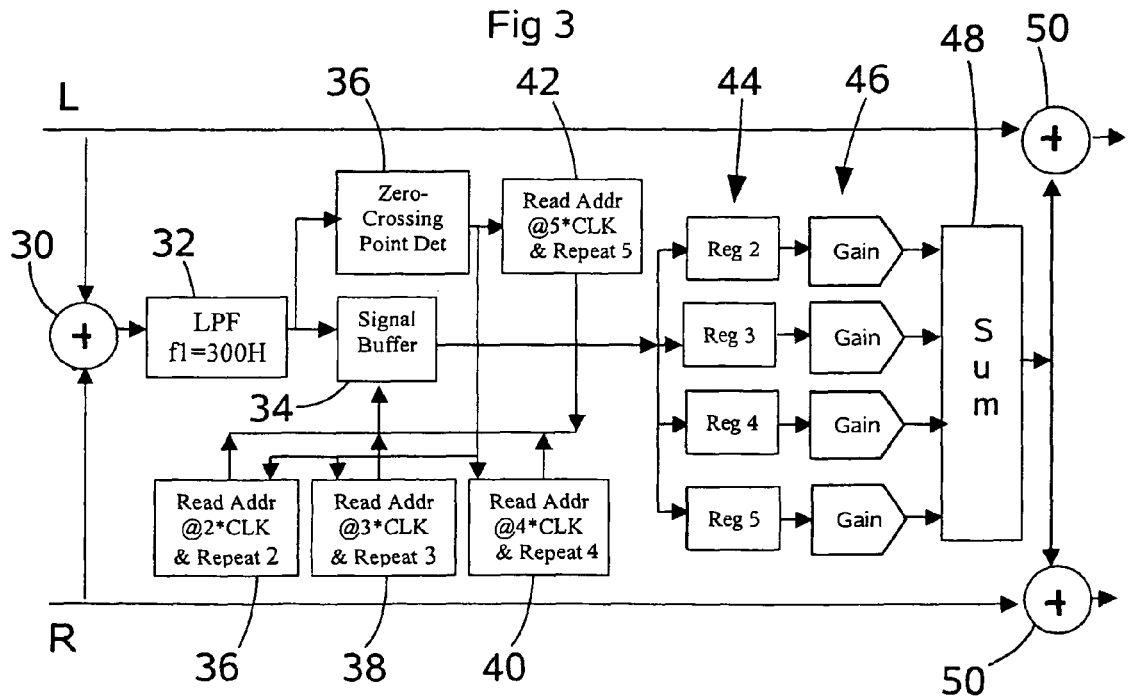
FIG. 4 illustrates an alternative bass enhancement algorithm that operates by generating harmonics by finding and repeating a waveform between two low-to-high zero-crossing points.

An alternative algorithm to avoid discontinuity within the harmonic waveforms is to segment the original waveform at zero-crossing points. More specially, the input signal is first analysed to find its low-to-high zero-crossing points (or high-to-low zero-crossing points). Then, the waveform is down-sampled and repeated between two successive zero-crossing points. The process is as illustrated in FIG. 1. Continuity between repeating waveform segments is guaranteed since each segment always ends and begins at zero-crossing points. A consequence of this approach is the segment length is variable since it is determined by the input signal. To allow for the situation where two adjacent zero-crossing points are far apart, sufficient memory to store the segment must be provided. Additionally, to handle the situation where two adjacent zero-crossing points very too close, for example when the signal is in silence during a high-pitch passage or were zero-crossing is produced by noise, a minimum separation between the successive zero-crossing points is imposed. The block diagram of the algorithm based on zero-crossing is shown as in FIG. 4.

Operation of the algorithm will now be described.

The L and R channel are added together at 30, and fed to a low-pass filter 32 to obtain the low frequency part of the incoming audio signal. The filtered signal is stored into a buffer memory 34. At the same time, low-to-high zero-crossing points are detected and recorded by a detector 36. A minimum separation in time between two successive zero-crossing points is imposed to avoid creating a segment that contains only small, near-zero fluctuations as might be caused by noise.

To generate harmonics, the signal in the buffer memory 34 is read out at different addressing rates. To generate the second harmonic, the reading address is incremented at a clock rate that is twice the input data rate and signal is read out, between two zero-crossing points, twice, as indicated at 36. The time duration for a twice-repeated reading of the signal at double the clock rate is exactly same as the duration of the signal written into the buffer. The process of reading out the signal will proceed to the signal segment between next pair of zero-crossing points. Similarly, the third, fourth, and fifth, and higher harmonics can also be generated, as indicated at 38, 40 and 42. To save the memory space, all these reading addresses can be multiplexed to read out the same input memory data. The reading out harmonics data are stored into their corresponding registers 44. These data can then be further weighted by different gains, illustrated at 46, and added together at 45 and added back to the original signal at 50.

In both of the above cases, the weighting to be given to each of the harmonics must be calculated. The aim is that the processed signal should be able, when reproduced, to create an audio effect of high perceived quality. For high perceived quality, it is generally an aim to produce a bass effect as close as possible to the original audio signal (in the perceptive of pitches, loudness and duration) while not cause excessive variation in the timbre of the signal. The unprocessed part of the original signal must also be aligned with the harmonics so that no delay can be perceived. An optimal bass effect can be achieved if the frequency response of the speaker system is known by analysing the original signal and adjusting the harmonic gains and delays by experiment.

Figure 5:
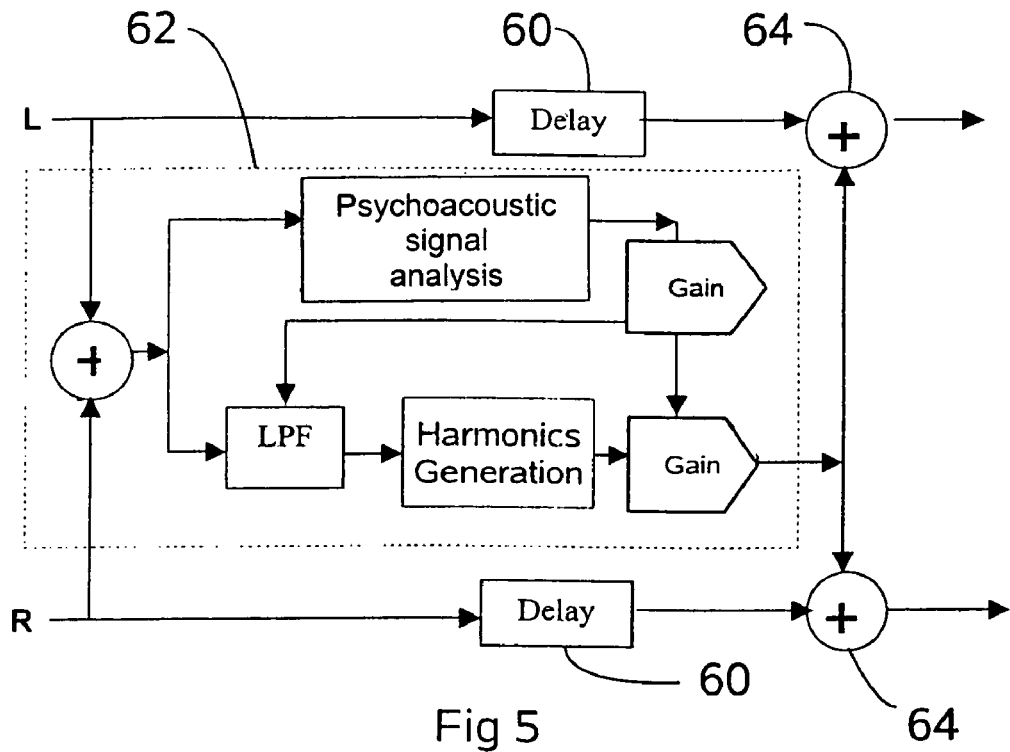
FIG. 5 is a block diagram of a bass enhancement system that uses methods that embody the invention.

A block diagram of the whole bass enhancement system is illustrated as in FIG. 5. This shows the left and right channels of the unfiltered audio signal are passed through respective delay circuits 60 in parallel with an enhancement module 62 to implement a bass enhancement algorithm as described above. The output of the enhancement module is added to the output of each of the delay circuits 60 by signal adders 64. Psychoacoustic signal analysis typically include analysis of the signal frequency, loudness and duration; that is, it analyses the basic features of the sound. Then, the results of the analysis can be used to adjust the cut-off frequencies of the filters, to select groups of harmonics and to adjust individual harmonic gains within the group. For example, the loudness of the original bass signal can be analysed and the gain of its harmonics can be adjusted to create the same perceived loudness effect. It may also include an analysis of the frequency of the bass signal to select the appropriate frequency response of the low-pass filters and/or dynamically adjust the number of harmonics and select the most appropriate group of harmonics.

Figure 6:
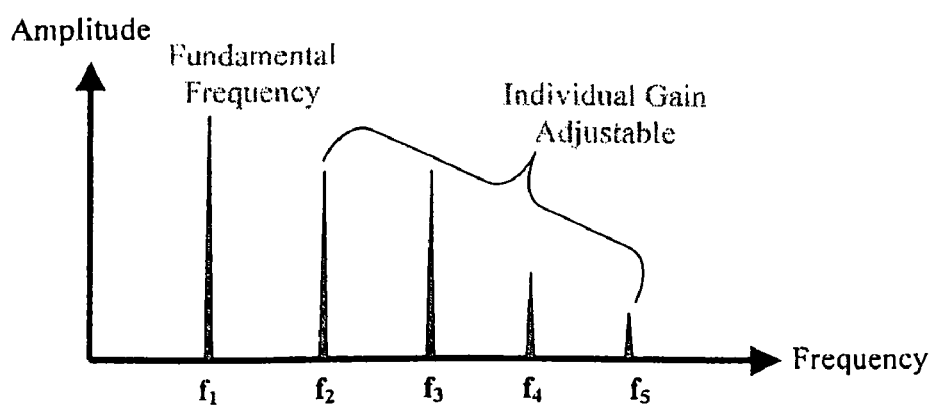
FIG. 6 is a frequency domain illustration of the generation of harmonics and gain control in an embodiment of the invention.

The optimal parameters of the bass enhancement system are also dependent upon the performance of the original speaker system. For example, it is important to know the frequency response of the original speaker to select a suitable cut-off frequency of the low pass filter or filters and to determine which order of the harmonics should be used. Optimal bass enhancement relies on the optimal adjustment of the gain applied to the generated harmonic components. The harmonic generating methods provided by these embodiments have the advantage in that the harmonics are individual generated and can therefore be separately adjusted by different gains. Combing with selecting one or more different low-pass filters with appropriate frequency responses, the desired bass enhancement effect can be easily implemented. This feature of the proposed method in frequency domain is shown in FIG. 6.

The above algorithms embodying the invention can be implemented by either hardware or software or in a hybrid system that uses both hardware and software.

The invention claimed is:

1. A method for enhancing an audio signal comprising:
   a. extracting from the signal components that fall within a stop band;
   b. generating a set of one or more harmonics of the extracted components using a method of down-sampling and repeating;
   c. weighting each harmonic by controlling its gain by application to it of a respective weighting factor; and
   d. adding the weighted harmonics to the audio signal to create an output signal, and further wherein low frequency components that are not easily reproduced are eliminated and higher frequency components are selected to provide a minimal perceptual effect.

2. A method according to claim 1 in which the weighting of each harmonic is determined by psychoacoustic analysis of an audio reproduction system by which the transformed signal will be reproduced.

3. A method according to claim 2 in which the psychoacoustic analysis includes analysis of the signal frequency, loudness and duration.

4. A method according to claim 1, in which each harmonic is generated by creating a down-sampled intermediate signal the audio signal and repeating the intermediate signal such that the harmonic is of duration equal to the audio signal.

5. A method according to claim 4 in which to generate the $n^{th}$ harmonic, the intermediate signal comprises every $n^{th}$ sample of the audio signal, and the harmonic comprises n repetitions of the intermediate signal.

6. A method according to claim 1, in which the audio signal is segmented prior to step a.

7. A method according to claim 6 in the segments are of equal time duration.

8. A method according to claim 4, in which the audio signal is segmented prior to step a. and the segments are of equal time duration, in which at least one of the start and the end values of the intermediate signal is adjusted such that the start and the end values are of equal value.

9. A method according to claim 6 in which each segment is bounded by a zero-crossing point of the audio signal.

10. A method according to claim 9 in which a segment is terminated at the first zero crossing of the signal that occurs after a predetermined minimum time has passed following the start of the segment.

11. A method according to claim 1, in which the components are extracted in step a. by passing the audio signal through a low-pass filter.

12. A method according to claim 1, in which, in step a., a plurality of sets of components within a stop band are extracted, and a set of weighted components are generated, in step b., for each of these sets of weighted components.

13. A method according to claim 12 in which the number of harmonics and/or their weightings for the sets of components are unequal.

14. A method according to 1, in which the audio signal is subject to a delay prior to step d.

15. A method according to 1, in which, in step b., two, three, four or five consecutive harmonics are generated.

16. A method according to claim 1, in which the audio signal is a digital signal and the method is performed in the digital domain.

* * * * *